US007358757B2

(12) United States Patent
Ando

(10) Patent No.: US 7,358,757 B2
(45) **Date of Patent: *Apr. 15, 2008**

(54) DISPLAY APPARATUS AND INSPECTION METHOD

(75) Inventor: Naoki Ando, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/425,449

(22) Filed: Jun. 21, 2006

(65) Prior Publication Data

US 2006/0226866 A1 Oct. 12, 2006

Related U.S. Application Data

(62) Division of application No. 11/136,960, filed on May 25, 2005, now Pat. No. 7,145,358.

(30) Foreign Application Priority Data

May 31, 2004 (JP) ........................... P2004-162048

(51) Int. Cl.
*G01R 31/00* (2006.01)

(52) U.S. Cl. ...................................................... 324/770

(58) Field of Classification Search ...................... None
See application file for complete search history.

(56) References Cited

U.S. PATENT DOCUMENTS

| | | | |
|---|---|---|---|
| 4,819,038 A | 4/1989 | Alt | |
| 5,576,730 A | 11/1996 | Shimada et al. | |
| 6,924,875 B2 | 8/2005 | Tomita | |
| 6,930,505 B2 | 8/2005 | Taguchi et al. | |
| 7,009,418 B2 | 3/2006 | Orii et al. | |
| 7,023,232 B2 * | 4/2006 | Yano et al. | 324/767 |

FOREIGN PATENT DOCUMENTS

| | | |
|---|---|---|
| JP | 10-097203 | 4/1998 |
| JP | 2001-188213 | 7/2001 |
| JP | 2001-201765 | 7/2001 |

* cited by examiner

*Primary Examiner*—Paresh Patel
(74) *Attorney, Agent, or Firm*—Sonnenschein Nath & Rosenthal LLP

(57) ABSTRACT

The test circuit of a display apparatus according to the invention detect short-circuiting in each of the data lines Dn by inputting the electric potential Vd of the data line Dn connected to the corresponding one of high resistance first short-circuiting detecting resistors Tr1*n* connecting a predetermined electric potential and the data line Dn to the corresponding one of first detector logic circuits and binarizing and outputting the input electric potential Vd of the data line Dn by referring to a predetermined threshold value and also detect short-circuiting in each of the gate lines Gm by inputting the electric potential of the gate line Gm connected to the corresponding one of high resistance second short-circuiting detecting resistors connecting a predetermined electric potential and the gate line Gm to the corresponding one of second detector logic circuits and binarizing and outputting the input electric potential of the gate line by referring to a predetermined threshold value. The defects (short-circuits) produced in the process of manufacturing the display apparatus can be inspected by a simple technique.

3 Claims, 7 Drawing Sheets

DISPLAY APPARATUS AND INSPECTION METHOD

RELATED APPLICATION DATA

This application is divisional of U.S. patent application Ser. No. 11/136,960, filed May 25, 2005 now U.S. Pat. No. 7,145,358, which is incorporated herein by reference to the extent permitted by law. This application claims the benefit of priority to Japanese Patent Application No. JP 2004-162048 filed in the Japanese Patent Office on May 31, 2004, which also is incorporated herein by reference to the extent permitted by law.

BACKGROUND OF THE INVENTION

1. Field of the Invention

This invention relates to a display apparatus comprising pixel cells arranged to form a matrix. More particularly, the present invention relates to an inspection method for detecting defects in the gate lines and the data lines for driving pixel cells of a display apparatus and also to a display apparatus adapted to such an inspection method.

2. Description of the Related Art

Liquid crystal display apparatus employing an active matrix system have been and being popularly used for liquid crystal projectors and liquid crystal displays.

A liquid crystal display apparatus employing an active matrix system typically comprises, if the apparatus is of the reflection type, pixel switches and pixel cells connected to the respective pixel switches and having respective pixel capacitances and the pixel cells are arranged on a semiconductor substrate to form a matrix. An opposed substrate carrying a common electrode is arranged vis-à-vis the semiconductor substrate and liquid crystal is put into the gap between the semiconductor substrate and the opposed substrate and held there as the gap is hermetically sealed.

In such a liquid crystal display apparatus, some of the gate lines for driving the pixel switches and the data lines for supplying pixel data to be written to the pixel capacitances by way of the respective pixel switches can be short-circuited by the shortcomings produced in the process of manufacturing the semiconductor substrate of the liquid crystal display apparatus and/or the dust coming into the apparatus. When such a problem of short-circuit arises, linear defects appear in the displayed image of the liquid crystal display apparatus.

Various techniques have been proposed to date for the purpose of detecting short-circuiting in the gate lines and the data lines that give rise to such linear defects.

For example, a technique of arranging pads at the ends of the data lines and the gate lines and applying a probe directly to the pads to detect short-circuiting (refer to Patent Document 1: Japanese Patent Application Laid-Open Publication No. 2001-201765) and a technique of arranging short-circuit test circuits connected to the data lines and the gate lines respectively at the side of the drive circuit for driving the data lines and the gate lines and at the side separated from the former side by the display region (refer to Patent Document 2: Japanese Patent Application Laid-Open Publication No. 10-97203) are known.

However, when a liquid crystal display apparatus is configured in such a way that it has a plurality of display regions produced by dividing the display region vertically or horizontally for the purpose of avoiding degradation of the quality of the displayed image due to the increase in the load of the data lines and the gate lines and the display regions produced by the division are driven independently, it is physically impossible to arrange pads or test circuits in a manner as described above.

Thus, there has been proposed a technique of connecting the data lines of each display region produced by dividing the overall display region by way of transistors and checking if there is a broken line or not by applying a voltage to an end of the data lines and observing the electric current flowing at the other end (refer to Patent Document 3: Japanese Patent Application Laid-Open Publication No. 2001-188213).

SUMMARY OF THE INVENTION

With the technique of connecting the data lines of each display region produced by dividing the overall display region by way of transistors as described in Patent Document 3, it is possible to detect short-circuit in the gate lines and the data lines in addition to broken lines. However, with the above described configuration, it is necessary to arrange elements other than the pixel cells in the display region of the liquid crystal display apparatus to consequently make the layout pattern in the display region uneven. Then, there arises a problem that the image quality of the image displayed on a liquid crystal display apparatus having such a configuration is adversely affected by the configuration.

In view of the above identified problem, it is desirable to provide a display apparatus comprising pixel cells arranged to form a matrix and an inspection method that can detect short-circuiting in the gate lines and the data lines for driving the pixel cells and also short-circuiting relating to the pixel cells easily in a short period of time even when the display region of the display apparatus is divided.

According to the present invention, the above object is achieved by providing a display apparatus comprising: a substrate carrying a plurality of pixel cells arranged to form a matrix, each having a pixel switch and a pixel capacitance connected to the pixel switch and adapted to hold the pixel data written by way of a data line; a gate line drive circuit for sequentially driving a plurality of gate lines connected to the pixel switches; a data line drive circuit for sequentially driving a plurality of data lines; a data line test circuit including pairs of a high resistance first short-circuiting detecting resistor for connecting a predetermined electric potential and the corresponding one of the data lines and a first detector logic circuit adapted to input the electric potential of the data line connected to the first short-circuiting detecting resistor and binarize and output the input electric potential of the data line by referring to a predetermined threshold value; and a gate line test circuit including pairs of a high resistance second short-circuiting detecting resistor for connecting a predetermined electric potential and the corresponding one of the gate lines and a second detector logic circuit adapted to input the electric potential of the gate line connected to the second short-circuiting detecting resistor and binarize and output the input electric potential of the gate line by referring to a predetermined threshold value.

Furthermore, according to the present invention, there is also provided an inspection method for inspecting a display apparatus comprising: a substrate carrying a plurality of pixel cells arranged to form a matrix, each having a pixel switch and a pixel capacitance connected to the pixel switch and adapted to hold the pixel data written by way of a data line; a gate line drive circuit for sequentially driving a plurality of gate lines connected to the pixel switches; and a data line drive circuit for sequentially driving a plurality of data lines; the method comprising; detecting short-circuiting in each of the data lines by inputting the electric potential of the data line connected to the corresponding one of high resistance first short-circuiting detecting resistors connecting a predetermined electric potential and the data line to the corresponding one of first detector logic circuits and binarizing and outputting the input electric potential of the data line by referring to a predetermined threshold value; and detecting short-circuiting in each of the gate lines by inputting the electric potential of the gate line connected to the corresponding one of high resistance second short-circuiting detecting resistors connecting a predetermined electric potential and the gate line to the corresponding one of second detector logic circuits and binarizing and outputting the input electric potential of the gate line by referring to a predetermined threshold value.

Furthermore, according to the present invention, there is provided a display apparatus comprising: a substrate carrying a plurality of pixel cells arranged to form a matrix, each having a pixel switch and a pixel capacitance connected to the pixel switch and adapted to hold the pixel data written by way of a data line; a gate line drive circuit for sequentially driving a plurality of gate lines connected to the pixel switches; a data line drive circuit for sequentially driving a plurality of data lines; a data line test circuit including pairs of a high resistance first short-circuiting detecting resistor for connecting a predetermined electric potential and the corresponding one of the data lines and a first comparator circuit adapted to input the electric potential of the data line connected to the first short-circuiting detecting resistor and compare the input electric potential of the data line and a reference potential, or the expected value of the input potential of the data line, so as to binarize and output the outcome of the comparison; and a gate line test circuit including pairs of a high resistance second short-circuiting detecting resistor for connecting a predetermined electric potential and the corresponding one of the gate lines and a second comparator circuit adapted to input the electric potential of the gate line connected to the second short-circuiting detecting resistor and compare the input electric potential of the gate line and a reference potential, or the expected value of the input potential of the gate line, so as to binarize and output the outcome of the comparison.

Furthermore, according to the present invention, there is also provided an inspection method for inspecting a display apparatus comprising: a substrate carrying a plurality of pixel cells arranged to form a matrix, each having a pixel switch and a pixel capacitance connected to the pixel switch and adapted to hold the pixel data written by way of a data line; a gate line drive circuit for sequentially driving a plurality of gate lines connected to the pixel switches; and a data line drive circuit for sequentially driving a plurality of data lines; the method comprising: detecting short-circuiting in each of the data lines by inputting the electric potential of the data line connected to the corresponding one of high resistance first short-circuiting detecting resistors connecting a predetermined electric potential and the data line to the corresponding one of first comparator circuits and comparing the input electric potential of the data line and a reference potential, or the expected value of the input potential of the data line, so as to binarize and output the outcome of the comparison; and detecting short-circuiting in each of the gate lines by inputting the electric potential of the gate line connected to the corresponding one of high resistance second short-circuiting detecting resistors connecting a predetermined electric potential and the gate line to the corresponding one of second comparator circuits and comparing the input electric potential of the gate line and a reference potential, or the expected value of the input potential of the gate line, so as to binarize and output the outcome of the comparison.

Thus, according to the invention, the electric potential of each of the data lines is input to the corresponding one of the first detector logic circuits for the data line that is connected to the corresponding one of the high resistance first short-circuiting detecting resistors for connecting a predetermined electric potential and the data line, and the first detector logic circuit binarizes the input electric potential of the data line and outputs it by referring to a predetermined threshold value in order to detect short-circuiting in each of the data lines. On the other hand, the electric potential of each of the gate lines is input to the corresponding one of the second detector logic circuits for the gate line that is connected to the corresponding one of the high resistance second short-circuiting detecting resistors for connecting a predetermined electric potential and the gate line, and the second detector logic circuit binarizes the input electric potential of the gate line and outputs it by referring to a predetermined threshold value in order to detect short-circuiting in each of the gate lines.

With this arrangement, it is possible to determine if a data line is short-circuited or not according to the digital value output from the corresponding first detector logic circuit and also if a gate line is short-circuited or not according to the digital value output from the corresponding second detector logic circuit. Thus, the detection error, if any, is less influential if compared with an arrangement that deals with analog values so that it is easy to test the data lines and it is possible to reduce the test time.

Additionally, if the display apparatus is a liquid crystal display apparatus, it is possible to detect any short-circuiting in the stage of containing liquid crystal in a hermetically sealed condition so that it is possible to prevent defective components from being mounted and hence reduce the unnecessary cost that arises due as a result of mounting such defective components. Additionally, it is also possible to detect any short-circuiting after the stage of containing liquid crystal in a hermetically sealed condition. In other words, it is possible to detect any short-circuiting throughout the manufacturing process and the result of the short-circuiting detecting operation can be fed back to the manufacturing process to further improve the manufacturing efficiency.

According to the invention, the data line test circuit and the gate line test circuit are arranged respectively at the side of the data line drive circuit and at the side of the gate line drive circuit on the substrate. With this arrangement, it is possible to detect any short-circuiting if the display region of a display apparatus is divided into a plurality of display regions in order to adapt itself to displaying a high definition image.

A display apparatus according to the invention comprises first comparator circuits, each of which is adapted to compare the electric potential of the corresponding data line input to it and a reference potential, which is the expected value of the input potential of the data line, and binarize the outcome of the comparison so as to output the binarized outcome and second comparator circuits, each of which is adapted to compare the electric potential of the corresponding gate line input to it and a reference potential, which is the expected value of the input potential of the gate line, and binarize the outcome of the comparison so as to output the binarized outcome. With this arrangement, it is possible to detect any short-circuiting highly accurately by selecting an appropriate reference voltage depending on the short-circuit resistance value to be detected.

Additionally, it is possible to detect short-circuiting in any of the pixel capacitances and/or the wires in the pixel cells by inputting the electric potential of each of the data lines that appears when the pixel capacitance of the related pixel cells are energized by sequentially driving the plurality of gate lines and energizing the pixel switches of the pixel cells by means of the gate line drive circuit to the corresponding one of the first detector logic circuits and binarizing the input electric potential of the data line, referring to a predetermined threshold value so as to output the outcome of binarization.

DETAILED DESCRIPTION OF THE PREFERRED EMBODIMENTS

Now, the present invention will be described by referring to the accompanying drawings that illustrate preferred embodiments of the invention. It should be noted, however, that the present invention is by no means limited to the described embodiments, which may be modified and altered in various different ways without departing from the scope of the invention.

Figure 1:
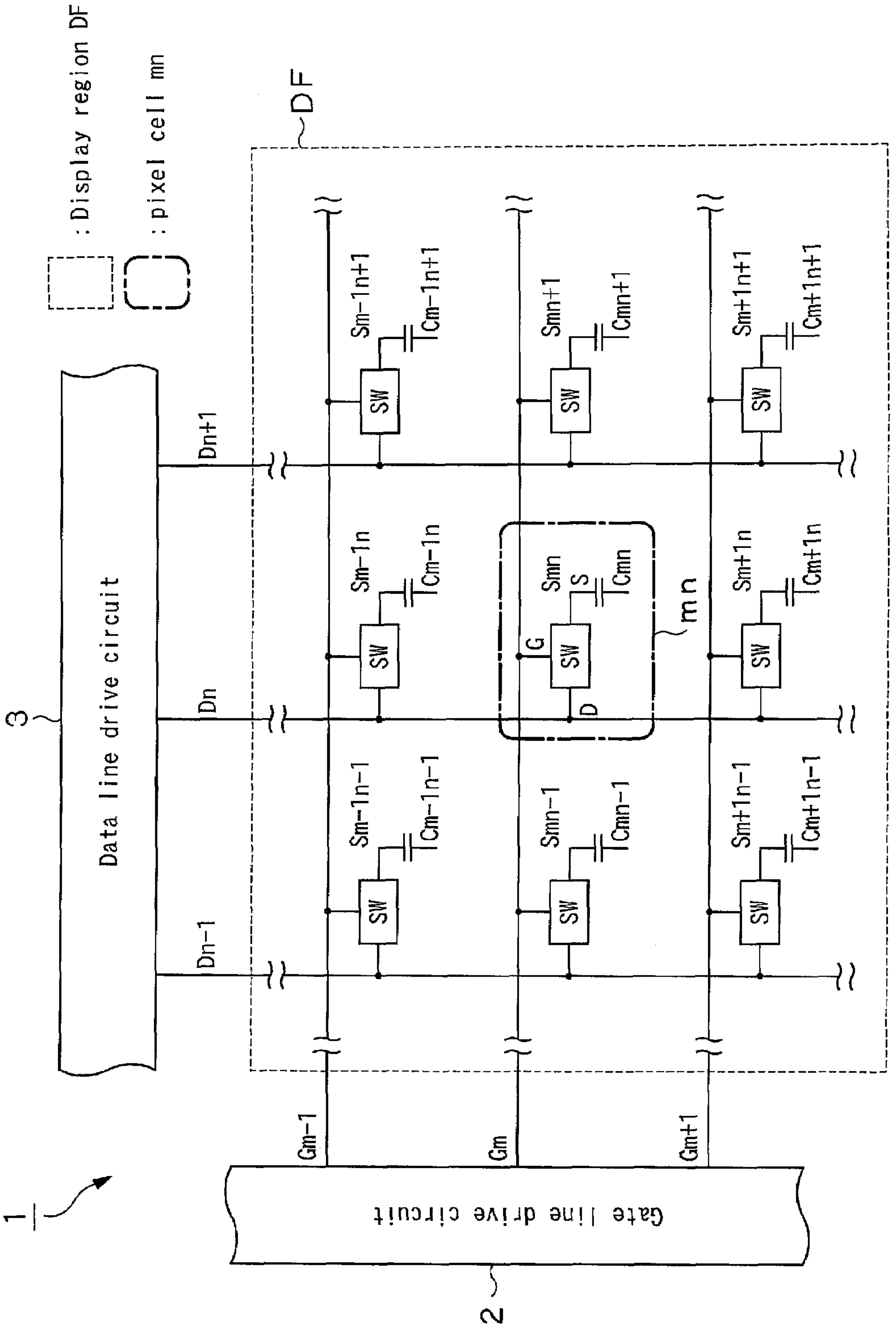
FIG. 1 is a schematic circuit diagram of a liquid crystal display apparatus according to the invention.

Firstly, an embodiment of a reflection type liquid crystal display apparatus employing an active matrix system will be described in terms of configuration. According to the invention, it is possible to detect any short-circuit in the gate lines and the data lines of the embodiment of liquid crystal display apparatus as shown in FIG. 1. The test circuits for detecting short-circuit is not described here because they will be described in detail hereinafter.

The reflection type liquid crystal display apparatus 1 employing an active matrix system as illustrated in FIG. 1 comprises a semiconductor substrate carrying a plurality of pixel cells mn (m and n being natural numbers) arranged to form a matrix, which by turn produces a display region DF, a gate line drive circuit 2 and a data line drive circuit 3, the gate line drive circuit 2 and the data line drive circuit 3 being provided with shift registers.

The pixel cells mn respectively have pixel switches Smn and pixel capacitances Cmn. N-channel type FETs (field effect transistors) are typically used for the pixel switches Smn. The source (S) of each of the pixel switches Smn is connected to a common electrode by way of the corresponding one of the pixel capacitances Cmn. A pixel electrode (not shown) is connected to the connection point of the source of each of the pixel switches Smn and the corresponding one of the pixel capacitances Cmn. Gate lines Gm that are drawn from the gate line drive circuit 2 are connected to the gates (G) of the pixel switches Smn, while data lines Dn that are drawn from the data line drive circuit 3 are connected to the drains (D) of the pixel switches Smn.

The gate line drive circuit 2 is adapted to sequentially operate the gate lines G1, G2, G3, . . . , Gm drawn horizontally and connected to the gates of the pixel switches Smn of the pixel cells mn. On the other hand, the data line drive circuit 3 is adapted to sequentially scan the data lines D1, D2, D3, . . . , Dn drawn vertically and connected to the drains of the pixel switches Smn of the pixel cells mn. In FIG. 1, the gate line drive circuit 2 is arranged to the left of the display region DF, whereas the date line drive circuit 3 is arranged above the display region DF.

Although not shown, an opposed electrode is arranged vis-à-vis the semiconductor substrate formed in the above described manner. The opposed electrode is a common electrode to which a common electric potential Vcom is applied. A liquid crystal layer is formed as liquid crystal is put into the gap between the semiconductor substrate and the opposed electrode that are arranged vis-à-vis relative to each other and held there as the gap is hermetically sealed. Thus, the liquid crystal display apparatus 1 has the above described configuration as a whole.

Figure 2:
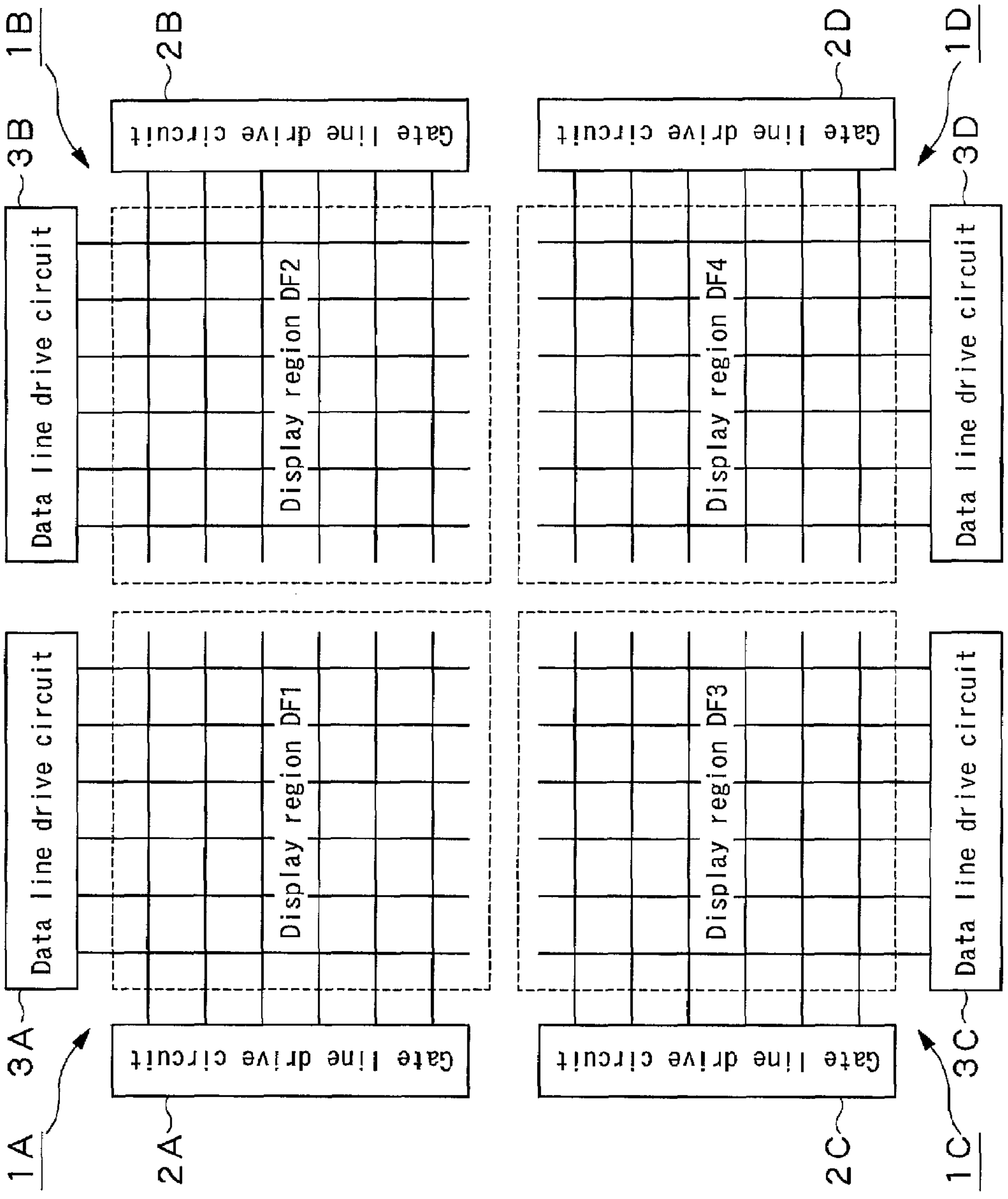
FIG. 2 is a schematic illustration of the display regions of the liquid crystal display apparatus of FIG. 1 produced by dividing the whole display region thereof.

When the liquid crystal display apparatus 1 is made to adapt itself to high definition video sources and display a high definition image, the display region DF is typically divided into four display regions including upper left display region, upper right display region, lower left display region and lower right display region as shown in FIG. 2. This is a technique for suppressing degradation of the image quality of the displayed image due to the load of the gate lines Gm and that of the data lines Dn that are increased as a result of the arrangement for displaying a high definition image. The four display regions DF1, DF2, DF3 and DF4 produced as a result of the division is made to be independent from each other. In other words, each of them is provided with gate lines and data lines that are dedicated to it and the gate lines and the data lines of the four display regions are respectively driven by dedicated gate line drive circuits 2A, 2B, 2C and 2D and dedicated data line drive circuits 3A, 3B, 3C and 3D to alleviate the load of the drive circuits as a whole. Differently stated, the liquid crystal display apparatus 1 is formed by arranging four liquid crystal display apparatus 1A, 1B, 1C and ID having respective display regions DF1, DF2, DF3 and DF4 in the form of a matrix.

According to the invention, it is possible to satisfactory detect short-circuit in the gate lines Gm and the data lines Dn of a liquid crystal display apparatus whose display region is divided in a manner as described above. Now, the method of detecting short-circuiting in the gate lines Gm and the data lines Dn according to the invention will be described by referring to FIG. 3.

Figure 3:
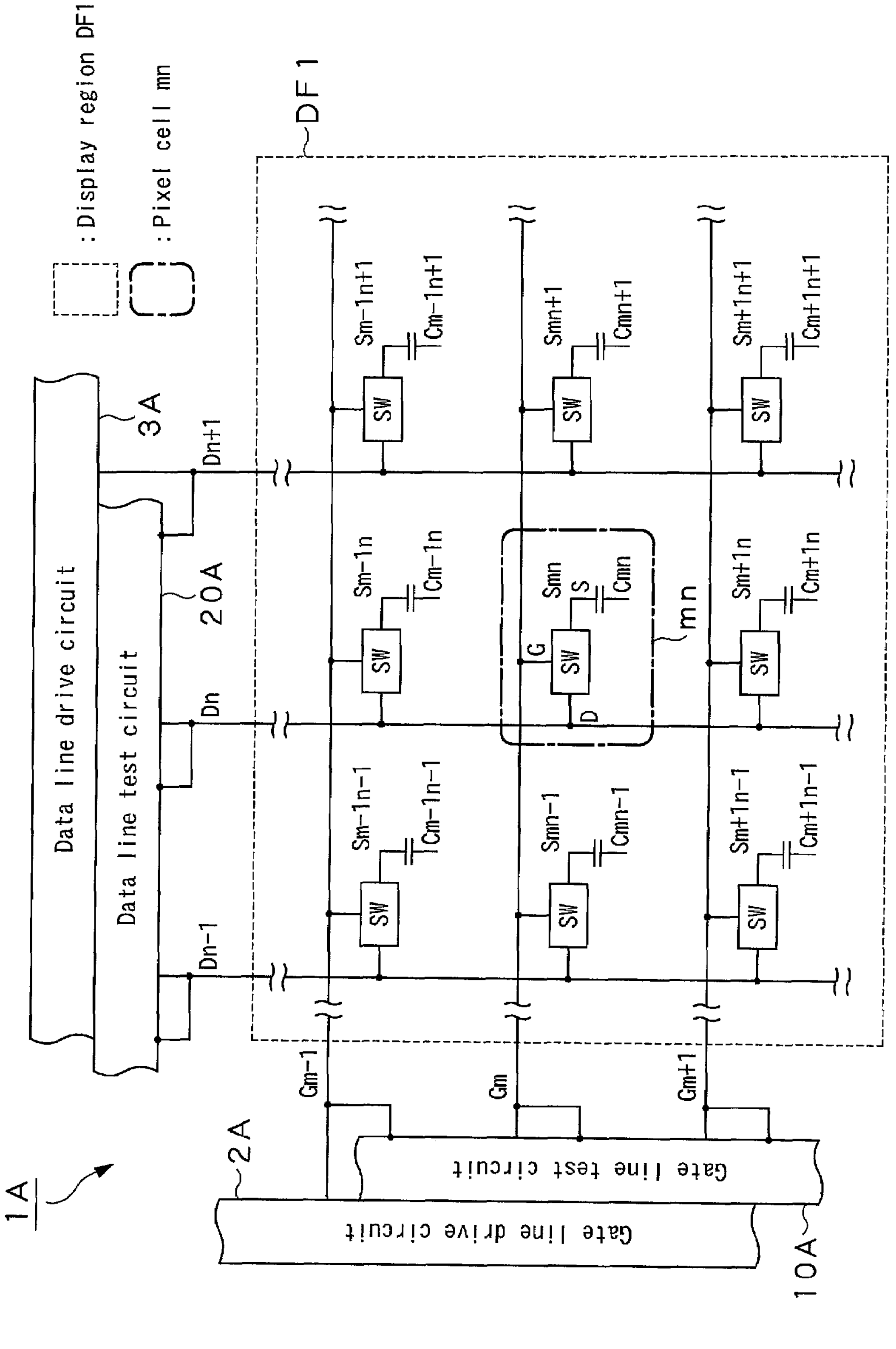
FIG. 3 is a schematic circuit diagram of the test circuits arranged in the liquid crystal display region produced by dividing the whole display region of the liquid crystal display apparatus of FIG. 1.

FIG. 3 schematically illustrates the display region DF1 of the liquid crystal display apparatus 1A. The method of detecting short-circuiting in the gate lines Gm and the data lines Dn of the liquid crystal display apparatus 1A will be described below. It will be appreciated that the method of detecting short-circuiting in the gate lines Gm and the data lines Dn of the liquid crystal display apparatus 1A can be equally applied to the other liquid crystal display apparatus 1B, 1C and 1D.

Referring to FIG. 3, the liquid crystal display apparatus 1A has the display region DF1 that is one of the display regions obtained by dividing the original display region DF by four. The pixel cells mn of the display region DF1 are driven by the gate line drive circuit 2A and the data line drive circuit 3A by way of the gate lines Gm and the data lines Dn respectively.

The liquid crystal display apparatus 1A is provided with a gate line test circuit 10A and a data line test circuit 20A for detecting short-circuiting in the gate lines Gm and in the data lines Dn respectively. The gate line test circuit 10A and the data line test circuit 20A are arranged at the side of the gate line drive circuit 2A and at the side of the data line drive circuit 3A and connected to the gate lines Gm and the data lines Dm respectively.

Both the gate line test circuit 10A and the data line test circuit 20A have a same circuit configuration and employ a same technique for detecting short-circuiting. Therefore, only the data line test circuit 20A will be described below. It will be appreciated that the description of the data line test circuit 20A equally applies to the gate line test circuit 10A.

First Embodiment

Figure 4:
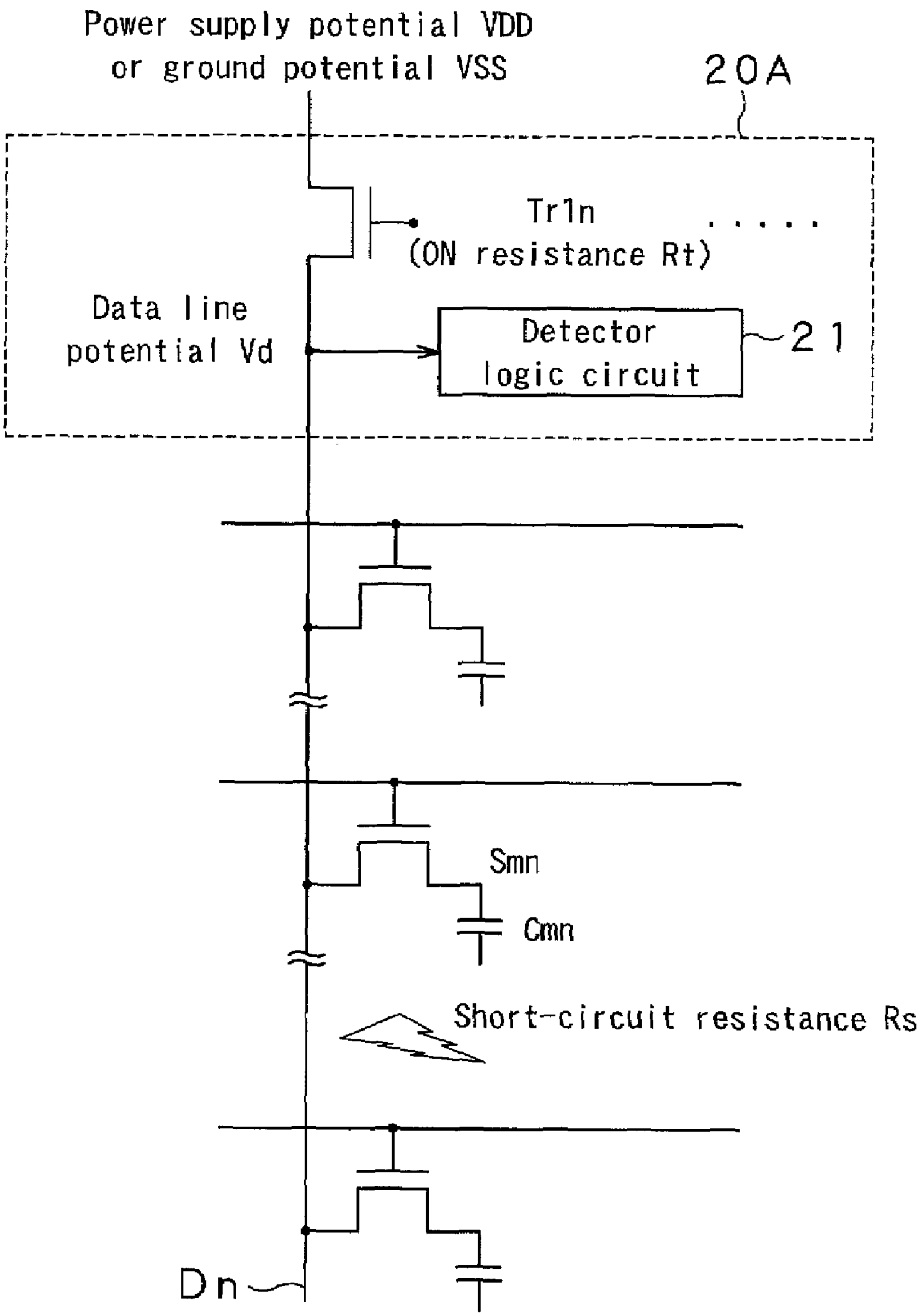
FIG. 4 is a schematic illustration of the first embodiment of data line test circuit that can be used for the liquid crystal display apparatus of FIG. 1.

Referring to FIG. 4 that illustrates the first embodiment of data line test circuit 20A, it comprises transistors Tr1*n* (n: natural number) connected to the respective data lines Dn and detector logic circuits 21 When short-circuit arises in the data lines Dn, the short-circuiting site shows a resistance value (short-circuit resistance) Rs.

When detecting short-circuiting in the data lines Dn, the transistors Tr1*n* are energized (ON) and a predetermined power supply potential VDD or the ground potential VSS is connected to the data lines Dn by way of the transistors Tr1*n*. The size of the transistors Tr1*n* is so adjusted as to show a high ON resistance Rt, which is the current to voltage ratio in the energized state.

Figure 5:
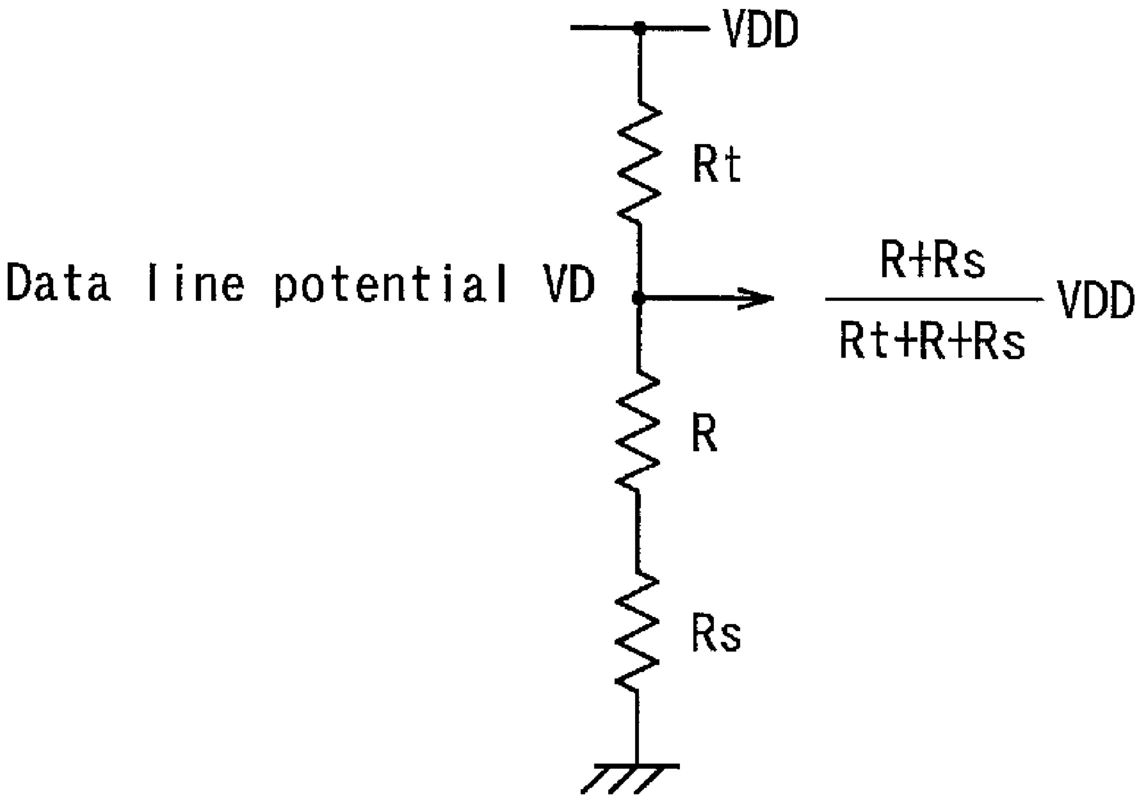
FIG. 5 is a circuit diagram of an equivalent circuit of the data line test circuit.

FIG. 5 is a circuit diagram of an equivalent circuit of the data line test circuit that can be used when a transistor Tr1*n* is turned on in order to detect short-circuiting in the data lines Dn. Referring to FIG. 5, each of the data lines is connected at an end thereof to the power supply potential VDD by way of the corresponding transistor Tr1*n* and at the other end thereof to the ground potential VSS directly without any transistor. When the data line Dn is connected to the power supply potential VDD by way of the transistor Tr1*n*, short-circuiting between the data line Dn and the ground potential VSS, if any, will be detected.

When detecting short-circuiting between the data line Dn and the power supply potential VDD, if any, the data line Dn is connected at an end thereof to the ground potential VSS by way of the corresponding transistor Tr1*n* and at the other end to the power supply potential VDD directly without any transistor. Since the equivalent circuit of FIG. 5 also applies to this situation, it will not be described any further.

As shown in FIG. 5, if there arises short-circuiting that entails a short-circuit resistance Rs on the data line Dn, the data line potential Vd is determined by formula (1) below as partial potential of the power supply potential VDD involving the ON resistance Rt of the transistor Tr1*n*, the short-circuit resistance Rs and the data line resistance R of the data line Dn.

$$Vd=(R+Rs)\cdot VDD/(Rt+R+Rs) \quad (1)$$

The data line potential Vd as determined by the above formula (1) is input to the corresponding detector logic circuit 21. The detector logic circuit 21 outputs a signal representing either existence of short-circuiting or non-existence of short-circuiting depending on the data line potential Vd input to it. If a short-circuit resistance Rs is found in the data line Dn, the data line potential Vd to be input to the detector logic circuit 21 is drawn to the side of the ground potential VSS so as to fall below the logical Vth that is the threshold value of the detector logic circuit 21 because the ON resistance of the transistor Tr1*n* is high.

If, on the other hand, no short-circuit resistance Rs is found, the data line potential Vd is higher than the logical Vth of the detector logic circuit 21 without being drawn to the side of the ground potential VSS. Therefore, it is possible to detect any short-circuiting in the data line Dn from the binarized output of the detector logic circuit 21. Thus, it is easy to test the data lines and it is possible to reduce the test time because the detector logic circuit 21 provides a binarized output signal representing either existence of short-circuiting or non-existence of short-circuiting from the input data line potential Vd.

Figure 6A:
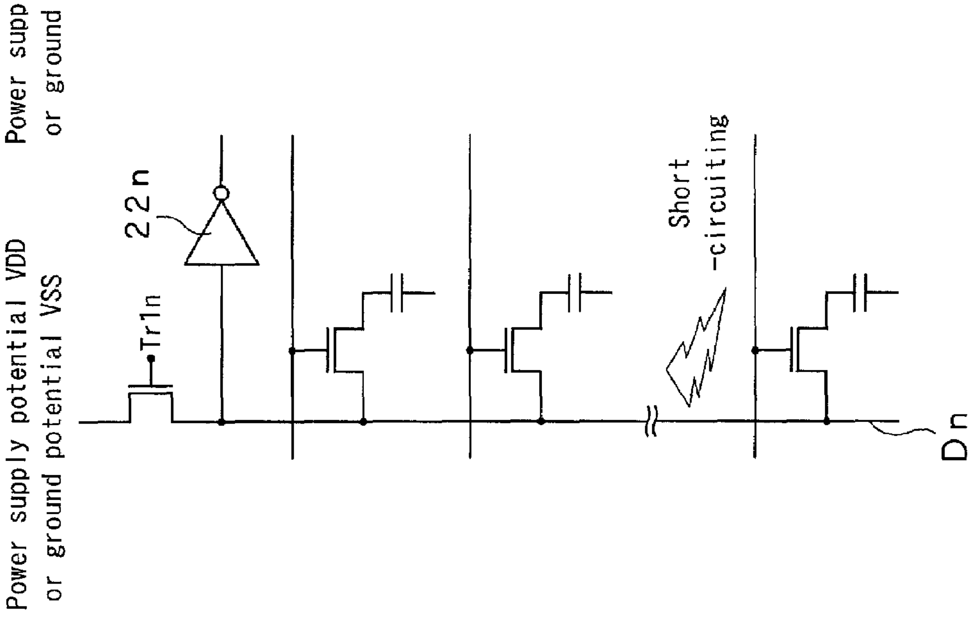
FIGS. 6A through 6C illustrate variations of the detector logic circuit that can be used for the data line test circuit of the liquid crystal display apparatus of FIG. 1.
Figure 6B:
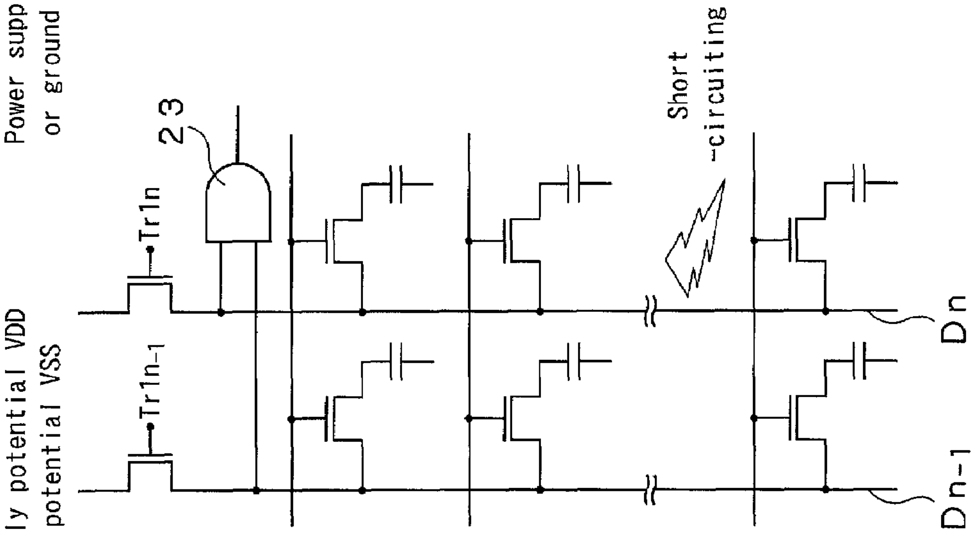
Figure 6C:
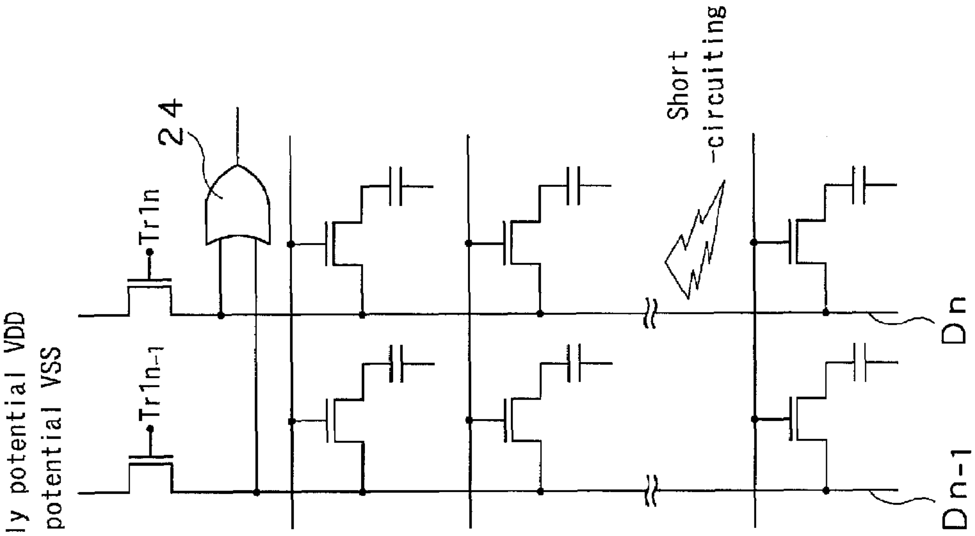

FIGS. 6A through 6C illustrate variations of the detector logic circuit 21 that can be used for the data line test circuit of the liquid crystal display apparatus of FIG. 1.

Referring to FIG. 6A, it is possible to use inverter circuits 22*n* (n: natural number) arranged to show 1 to 1 correspondence to the data lines Dn for the detector logic circuits 21. It is possible to detect existence or non-existence of short-circuiting in each of the data lines Dn by seeing the binarized output that shows if the data line potential Vd input to the corresponding inverter circuit 22*n* is higher or lower than the logical Vth of the inverter circuit 22*n*.

It is also possible to use AND circuits 23 or OR circuits 24, each having two or more than two inputs, for the detector logic circuits 21 as seen from FIGS. 6B and 6C. The data line potentials Vd of the data lines Dn to be inspected are input to the AND circuits 23 or the OR circuits 24. Then, it is possible to collectively inspect short-circuiting in the data lines Dn to be inspected by seeing if all the input data line potentials Vd are high or not for the AND circuits 23 or if all the input data line potentials Vd are low or not for the OR circuits 24.

It is also possible to detect short-circuiting in adjacently located data lines Dn by connecting them to the power supply potential VDD or the ground potential VSS by way of respective transistors Tr1*n* and inputting their data line potentials Vd to an AND circuit 23 or an OR circuit 24.

It may be appreciated that logic circuits other than those illustrated in FIGS. 6A, 6B and 6C can alternatively be used for the detector logic circuits 21. In short, the present invention is not limited by the type of logic circuit.

The behavior of the detector logic circuits 21 relative to the data line potential Vd can be modified by further raising the ON resistance Rt of the transistors Tr1*n* to change the data line potential Vd to be detected and adjusting the logical Vth of the detector logic circuits 21. Then, it is possible to raise the detection sensitivity for detecting short-circuiting in the data lines Dn.

The data line test circuit 20A can be used to detect short-circuiting not only in the data lines Dn but also in the pixel capacitances Cmn and in the pixel cells mn without modifying its circuit configuration. More specifically, the transistor Tr1*n* connected to a data line Dn is held ON and a gate line Gm is driven to turn on the pixel switch Smn of the pixel cell mn located at the crossing. Then, the pixel capacitance Cmn is energized as a result. Thus, the data line potential Vd changes as a function of the state of the energized pixel capacitance Cmn and the wiring condition of the pixel cell mn. Therefore, the data line test circuit 20A can detect short-circuiting relating to the pixel cell that may be short-circuiting in the pixel capacitance Cmn or in the wiring of the pixel cell mn.

As pointed out earlier, the gate line test circuit 10A can inspect the gate lines Gm for short-circuiting because it has a circuit configuration same as that of the data line test circuit 20A.

Second Embodiment

Figure 7:
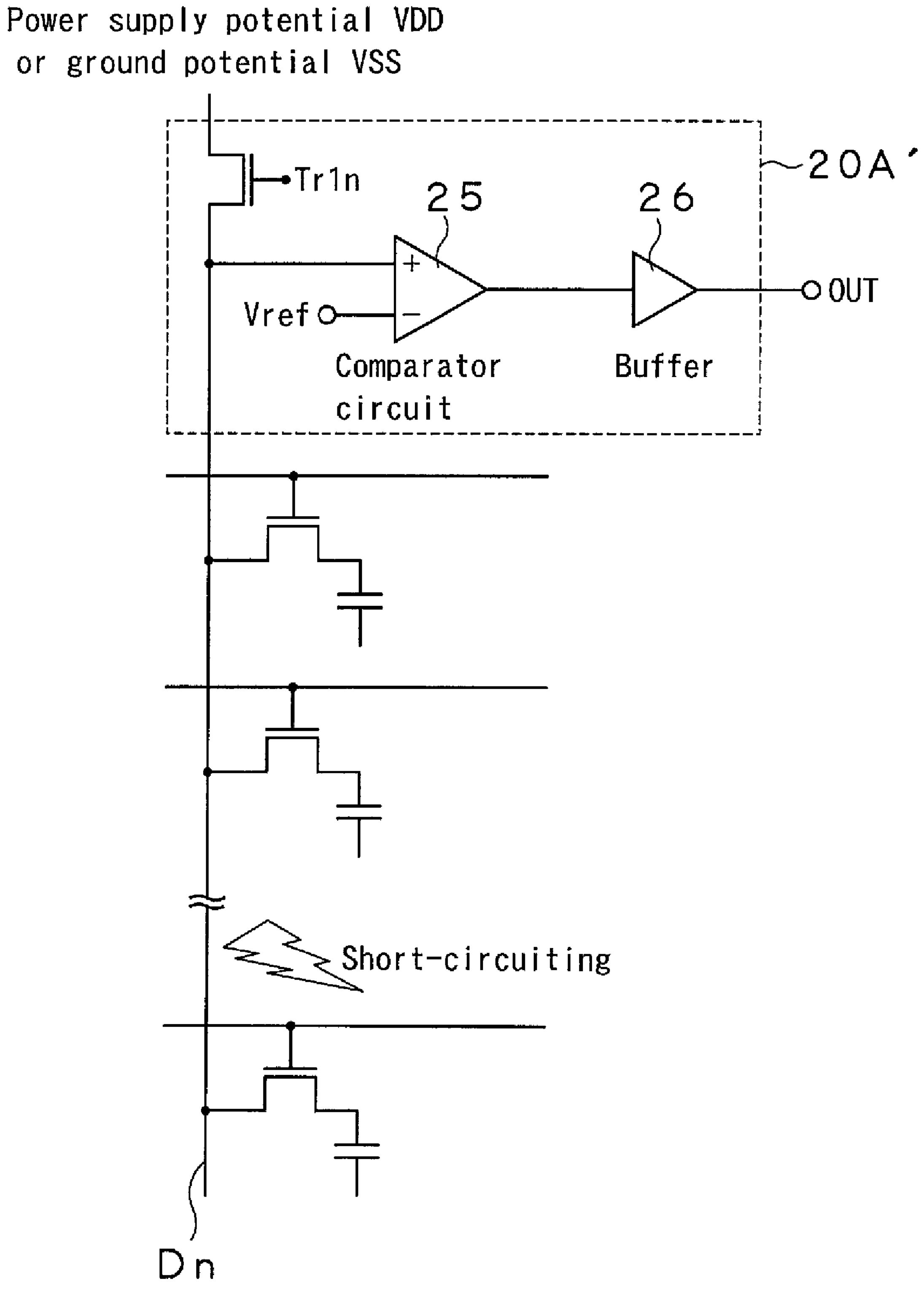
FIG. 7 is a schematic illustration of the second embodiment of data line test circuit that can be used for the liquid crystal display apparatus of FIG. 1.

Now, the second embodiment of data line test circuit 20A' will be described by referring to FIG. 7. As seen from FIG. 7, the data line test circuit 20A' differs from the data line test circuit 20A of the first embodiment in that the detector logic circuits 21 are replaced by comparator circuits 25 and buffers 26.

Each of the comparator circuits 25 receives the data line potential Vd of the corresponding data line Dn at one of its input terminals and a reference voltage Vref at the other input terminal as input. The comparator circuit 25 compares the data lint potential Vd and the reference voltage Vref and binarizes the outcome of the comparison. The binary signal representing the outcome of the comparison is output by way of the corresponding buffer 26. The comparator circuit 25 may be a differential input circuit or a comparator. Thus, it is easy to test the data lines and it is possible to reduce the test time because the comparator circuit 25 outputs the detected short-circuiting in the data line Dn as a binary signal if it is detected as a result of comparing the data line potential Vd and the reference voltage Vref.

The reference voltage Vref that is input to the other input terminal of the comparator circuit 25 may be the supply voltage of the liquid crystal display apparatus 1 or a voltage generated in the liquid crystal display apparatus 1. Alternatively, it may be an externally input voltage. In any case, it is required to show the voltage value that is expected when a short-circuit resistance Rs exist in the data line Dn.

If the data line Dn and the power supply voltage VDD are connected to each other by way of the transistor Tr1*n* and the data line Dn is short-circuited to the ground potential VSS, the data line potential Vd that is applied to the one of the input terminal of the comparator circuit 25 takes the value expressed by the above described formula (1).

At this time, since the ON resistance Rt of the transistor Tr1*n* and the data line resistance R can be roughly determined, short-circuiting, if any, can be detected highly accurately if an appropriate value is selected for the reference voltage Vref according to the short-circuit resistance Rs to be detected. In other words, short-circuiting can be detected highly accurately by selecting the expected data line potential Vd that may most probably arise for the estimated short-circuit resistance Rs as reference voltage Vref.

For example, if the ON resistance Rt of the transistor Tr1*n* is Rt=50 kΩ and the data line resistance R is R=1 kΩ, short-circuiting up to a short-circuit resistance Rs of Rs=1 kΩ can be detected by selecting the value obtained for the data line potential Vd by substituting the corresponding terms of the formula (1) by the above values, or the expected value of Vd=0.67 VDD, for the reference voltage Vref On the other hand, to detect short-circuiting between the data line Dn and the supply potential VDD, the data line Dn is connected to the ground potential VSS by way of the transistor Tr1*n* in order to give rise to short-circuiting relative to the power supply potential VDD.

The data line test circuit 20A' can be used to detect short-circuiting not only in the data lines Dn but also in the pixel capacitances Cmn and in the pixel cells mn without modifying its circuit configuration. More specifically, the transistor Tr1*n* connected to a data line Dn is held ON and a gate line Gm is driven to turn on the pixel switch Smn of the pixel cell mn located at the crossing. Then, the pixel capacitance Cmn is energized as a result. Thus, the data line potential Vd changes as a function of the state of the energized pixel capacitance Cmn and the condition of the pixel cell mn. Therefore, the data line test circuit 20A' can detect short-circuiting relating to the pixel cell that may be short-circuiting in the pixel capacitance Cmn or in the wiring of the pixel cell mn.

As pointed out earlier, the gate line test circuit 10A can inspect the gate lines Gm for short-circuiting because it has a circuit configuration same as that of the data line test circuit 20A'.

While the liquid crystal display apparatus 1 described above so as to represent the best mode of carrying out the present invention is a reflection type liquid crystal display apparatus employing an active matrix system and comprising pixel cells mn and other components arranged on a semiconductor substrate, the present invention is by no means limited thereto. For example, the present invention can equally apply to a transmission type TFT (thin film transistor) liquid crystal display comprising pixel cells and other circuit components arranged on a glass substrate, which is an insulating substrate, to detect short-circuiting in the data lines, short-circuiting in the gate lines and/or short-circuiting in the pixel cells including the pixel capacitances and the wires in the pixel cells.

It should be understood by those skilled in the art that various modifications, combinations, sub-combinations and alterations may occur depending on design requirements and other factors insofar as they are within the scope of the appended claims or the equivalents thereof

What is claimed is:

1. An inspection method for inspecting a display apparatus, said apparatus comprising:

a substrate carrying a plurality of pixel cells arranged to form a matrix, each having a pixel switch and a pixel capacitance connected to the pixel switch and adapted to hold the pixel data written by way of a data line;

a gate line drive circuit for sequentially driving a plurality of gate lines connected to the pixel switches; and a data line drive circuit for sequentially driving a plurality of data lines; the method comprising:

detecting short-circuiting in each of the data lines by inputting to a corresponding comparator circuit selected from a first set of comparator circuits a corresponding input electric potential of the data line, wherein, the data line is connected to a corresponding resistor, said corresponding resistor being one of a first set of high ON resistance short-circuit-detecting resistors, the resistor connecting a predetermined electric potential and the data line; and comparing the input electric potential of the data line to at least one of a reference potential and an expected value of the input potential of the data line, so as to binarize and output the outcome of the comparison; and detecting short-circuiting in each of the gate lines by inputting to a corresponding comparator circuit selected from a second set of comparator circuits a corresponding input electric potential of the gate line, wherein, the gate line is connected to a corresponding resistor, said corresponding resistor being one of a second set of high ON resistance short-circuit-detecting resistors, the resistor connecting a predetermined electric potential and the gate line; and comparing the input electric potential of the gate line to at least one of a reference potential and an expected value of the input potential of the gate line, so as to binarize and output the outcome of the comparison.

2. The method according to claim 1, wherein short-circuiting is detected by: inputting the corresponding input electric potential of each of the data lines that appears when the pixel capacitance of the related pixel cells are energized, wherein said related pixel cells are energized by sequentially driving the plurality of gate lines and energizing the pixel switches of the pixel cells by means of the gate line drive circuit; and comparing the input electric potential of the data line to at least one of a reference potential and an expected value of the input potential of the data line, so as to binarize and output the outcome of the comparison.

3. The method according to claim 1, wherein the resistor is a transistor adapted to show a high ON resistance in an energized state.

* * * * *